US009269415B1

United States Patent
Liu et al.

(10) Patent No.: US 9,269,415 B1
(45) Date of Patent: Feb. 23, 2016

(54) UTILIZATION OF THE ANOMALOUS HALL EFFECT OR POLARIZED SPIN HALL EFFECT FOR MRAM APPLICATIONS

(71) Applicant: INTERNATIONAL BUSINESS MACHINES CORPORATION, Armonk, NY (US)

(72) Inventors: Luqiao Liu, Yorktown Heights, NY (US); Jonathan Z. Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/490,218

(22) Filed: Sep. 18, 2014

(51) Int. Cl.
| | |
|---|---|
| G11C 11/18 | (2006.01) |
| G11C 11/16 | (2006.01) |
| H01L 43/04 | (2006.01) |
| H01L 43/06 | (2006.01) |
| H01L 27/22 | (2006.01) |

(52) U.S. Cl.
CPC ............ *G11C 11/1675* (2013.01); *G11C 11/18* (2013.01); *H01L 27/222* (2013.01); *H01L 43/04* (2013.01); *H01L 43/065* (2013.01)

(58) Field of Classification Search
None
See application file for complete search history.

(56) References Cited

U.S. PATENT DOCUMENTS

| | | | |
|---|---|---|---|
| 6,483,741 B1 | 11/2002 | Iwasaki et al. | |
| 6,791,792 B2 | 9/2004 | Takahashi | |
| 8,093,897 B2 | 1/2012 | Pan | |
| 8,295,006 B2 | 10/2012 | Sugano et al. | |
| 9,128,142 B1 * | 9/2015 | Qu | G01R 33/1284 |
| 2010/0097063 A1 | 4/2010 | Ando et al. | |
| 2013/0015542 A1 * | 1/2013 | Wang | H01L 43/08 257/421 |

OTHER PUBLICATIONS

Appendix P, List of IBM Patents or Patent Applications Treated as Related dated Sep. 22, 2014, 2 pages.
De Brosse, J.K. et al., "Spin Hall Effect Assisted Spin Transfer Torque Magnetic Random Access Memory", U.S. Appl. No. 13/967,694, filed Aug. 15, 2013, 16 pages.
De Brosse, J.K. et al., "Spin Hall Effect Assisted Spin Transfer Torque Magnetic Random Access Memory", U.S. Appl. No. 13/835,355, filed Mar. 15, 2013, 24 pages.
Liu, Luqiao et al., "Spin-Torque Switching with the Giant Spin Hall Effect of Tantalum", Science Magazine, vol. 336, No. 6081, May 4, 2012, pp. 555-558.
Liu, Luqiao, et al., "Current-Induced Switching of Perpendicularly Magnetized Magnetic Layers Using Spin Torque from the Spin Hall Effect", Physical Review Letters, vol. 109, No. 9, 096602, Aug. 2012, 5 pages.
Miron, Ion M., "Perpendicular switching of a single ferromagnetic layer induced by in-plane current injection" Nature, vol. 476, No. 7359, 2011, pp. 189-193.
Pai, Chi-Feng et al., "Spin transfer torque devices utilizing the giant spin Hall effect of tungsten", Applied Physics Letters, vol. 101, No. 12, 122404, 2012, 4 pages.

* cited by examiner

*Primary Examiner* — James G Norman
(74) *Attorney, Agent, or Firm* — Cantor Colburn LLP; Vazken Alexanian

(57) ABSTRACT

Embodiments are directed to using an anomalous hall effect (AHE) or a polarized spin hall effect (PSHE) to switch a magnetic moment of a free layer having perpendicular magnetic anisotropy (PMA). AHE/PSHE includes materials with spontaneous magnetic moment. Thus, the spin orientation generated by AHE/PSHE not only depends upon the geometrical orientation, but also on the magnetic moment orientation of the AHE/PSHE material. Therefore, out-of-plane polarized spins are injected into the magnetic free layer, and the corresponding spin current switches the magnetic moment of a magnetic free layer with PMA through the anti-damping mechanism. In some embodiments, an asymmetric bottom lead may be used, such that a tunneling current flows toward one side after it leaves the free layer.

20 Claims, 8 Drawing Sheets

UTILIZATION OF THE ANOMALOUS HALL EFFECT OR POLARIZED SPIN HALL EFFECT FOR MRAM APPLICATIONS

BACKGROUND

The present disclosure relates generally to electronic memory technology, and more specifically to generating spin current for spin transfer torque magnetic random access memory (STT-MRAM) using an anomalous hall effect and/or polarized spin hall effect.

Electronic memory may be classified as either volatile or non-volatile. Volatile memory requires constant power to retain stored data, while non-volatile memory does not. A common memory found in computers is volatile random access memory (RAM), which provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a transistor, a magnetic tunnel junction (MTJ) device for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of the MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism.

The term "magnetoresistance" describes the effect whereby a change to certain magnetic states of the MTJ storage element results in a change to the MTJ resistance, hence the name "Magnetoresistive" RAM. A typical MTJ includes a fixed magnetic layer, a thin dielectric tunnel barrier and a free magnetic layer. The MTJ has a low resistance when the magnetic moment of its free layer is parallel to the magnetic moment of its fixed layer. Conversely, the MTJ has a high resistance when its free layer magnetic moment is oriented anti-parallel to its fixed layer magnetic moment. The MTJ can be read by activating its associated word line transistor, which switches current from a bit line through the MTJ. The MTJ resistance can be determined from the sensed current, which is itself based on the polarity of the free layer. Conventionally, if the fixed layer and free layer have the same polarity, the resistance is low and a "0" is read. If the fixed layer and free layer have opposite polarity, the resistance is higher and a "1" is read.

Spin Transfer Torque MRAM (STT-MRAM) uses electrons that have been spin-polarized to switch the magnetic state of the MTJ free layer. During the write operation, the spin-polarized electrons exert a torque on the free layer, which can switch the free layer magnetic state. Thus, the required amount of STT-MRAM writing current depends on how efficiently spin polarization is generated. Additionally, designs that keep write currents small (e.g., $I_c<25$ microampere) are important to improving STT-MRAM scalability. This is because a larger switching current would require a larger transistor area, which would inhibit the ability to scale up STT-MRAM density.

A typical STT-MRAM configuration uses a thin film (e.g., spin filter) to spin polarize electrons as they pass through the film. The Spin Hall Effect (SHE) has been proposed as an alternative approach to generating spin polarized electrons and their resultant spin current. For example, a non-magnetic SHE material could, in theory, be used to generate spin current in the transverse direction while a charge current flows longitudinally. The generated spin current can be injected into an adjacent layer to switch the adjacent layer's magnetic state. For each electron that passes through the SHE material there can be more than one spin injected into the adjacent layer, which can result in a high rate of efficiency in transferring the spin angular momentum.

However, it can be difficult to combine SHE material with an MTJ. For example, as described above, the tunneling current through the MTJ and the current that provides the SHE flow in different paths and in different directions (e.g., orthogonal to one another). In conventional designs, three terminal devices are used wherein the tunneling current across the MTJ and the current that generates the SHE torque are applied across different pairs of terminals. These and other issues are addressed by a pending U.S. patent application, assigned to the assignee of the present disclosure and filed Mar. 15, 2013, entitled "SPIN HALL EFFECT ASSISTED SPIN TRANSFER TORQUE MAGNETIC RANDOM ACCESS MEMORY," by John K. DeBrosse, Luqiao Liu and Daniel Worledge, having U.S. application Ser. No. 13/835,355, and expressly incorporated by reference herein.

Other designs that attempt to use SHE material to switch a free layer magnetic state generally deal with MTJs having in-plane magnetic anisotropy, which means that the activation energy cannot be very high for small junctions (e.g., L. Liu et al., "Spin-Torque Switching with the Giant Spin Hall Effect of Tantalum," Science, Volume 336, No. 6081, 4 May 2012, pp. 555-558). Although designs have been proposed for using SHE material to switch a free layer magnetic state having perpendicular magnetic anisotropy (PMA), these designs suffer from significant inefficiencies (e.g., I. M. Miron, K. Garello, G. Gaudin, P.-J. Zermatten, M. V. Costache, S. Auffret, S. Bandiera, B. Rodmacq, A. Schuhl and P. Gambardella, Nature (London) 476, 189 (2011); and Luqiao Liu, O. J. Lee, T. J. Gudmundsen, D. C. Ralph and R. A. Buhrman, Phys. Rev. Lett. 109, 096602 (2012)).

Accordingly, there still is a need for non-volatile memory that efficiently lowers the switching current for STT-MRAM configurations having PMA.

SUMMARY

Embodiments are directed to a method of setting a magnetic state of a free layer, the method comprising: applying a write current to a magnetic layer that exhibits an anomalous hall effect (AHE) in response to said write current; said AHE generating out-of-equilibrium electron spins; said out-of-equilibrium spins generating a spin current; and injecting said spin current into the free layer, thereby setting the magnetic state of the free layer. The above described embodiments may further include the free layer comprising perpendicular magnetic anisotropy; and said electron spins comprise an out-of-plane direction.

Embodiments are directed to a spin transfer torque magnetic random access memory (STT-MRAM) comprising: a free layer having a magnetic state; a magnetic layer that exhibits an anomalous hall effect (AHE) in response to a write current; said AHE generating out-of-equilibrium electron spins; and said out-of-equilibrium electron spins generating a spin current; whereby said AHE injects said spin current into said free layer to set said magnetic state of said free layer. The above described embodiments may further include said free layer comprising perpendicular magnetic anisotropy (PMA); and said electron spins comprise an out-of-plane direction.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features and advantages are apparent from the following detailed description taken in conjunction with the accompanying drawings in which:

FIG. 1b is a side view of the memory cell shown in FIG. 1a;

Figure 1A:
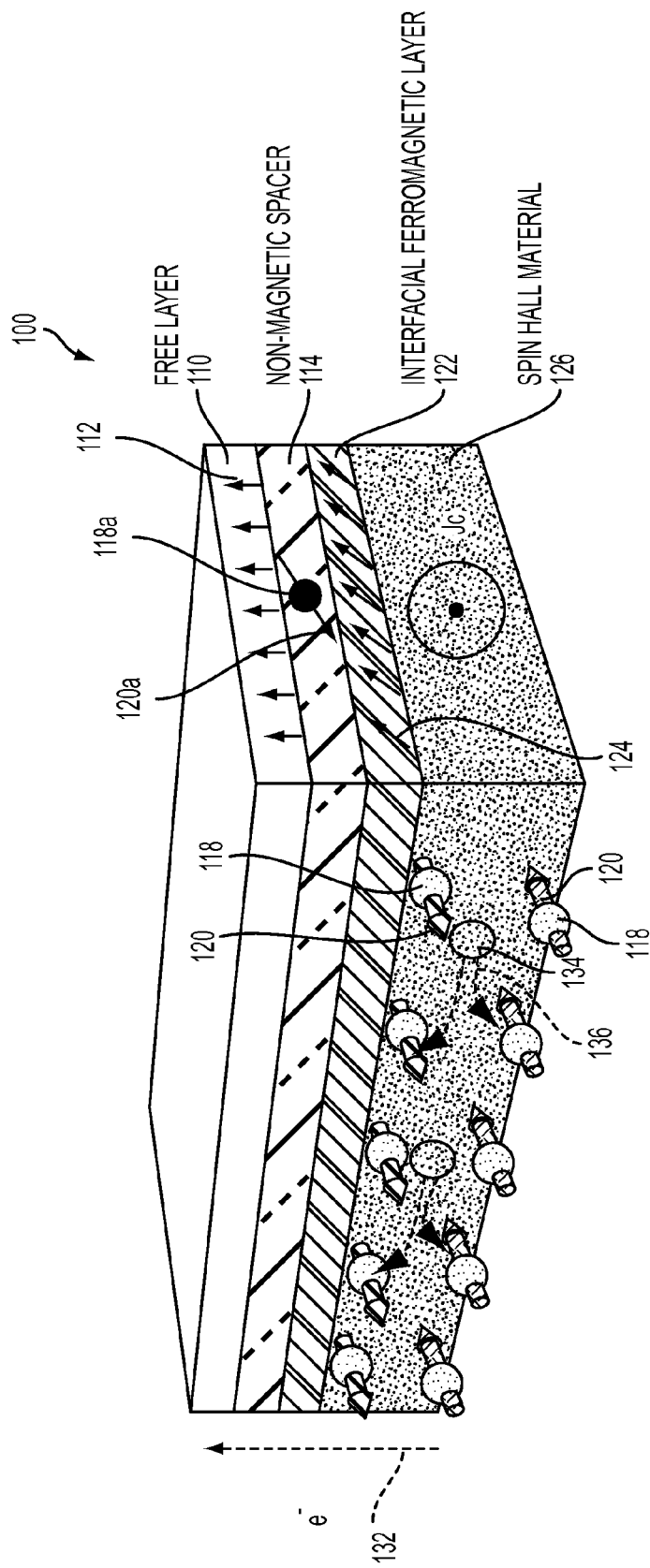
FIG. 1a is three dimensional diagram illustrating a portion of a memory cell in accordance with one or more embodiments.

In the accompanying figures and following detailed description of the disclosed embodiments, the various elements illustrated in the figures are provided with three-digit reference numbers. The leftmost digit of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

In ordinary, non-magnetic SHE materials, the direction of the current flow caused by the SHE is given by the cross product of the charge current and spin orientation according to the equation $J_s = \theta * J_c \times \sigma$, where $J_c$ is the current flowing direction, $\sigma$ is the spin orientation and $\theta$ is a scalar quantity called the spin Hall angle, which gives the magnitude of the effect. To switch a magnetic moment of a free layer using the spin current generated with standard, non-magnetic SHE, it would be necessary to place the free layer adjacent to the non-magnetic SHE film, either on top or on the bottom of the SHE material. Thus, the current flow direction would be constrained in the horizontal direction, and the magnetic free layer is either on top or at the bottom of the SHE film. Thus, the orientations of the spins injected into the magnetic free layer are fixed and always in the film plane. This symmetry of the spin polarization of the generated spin current is determined by the symmetry of the spin orbit coupling and holds for all of the materials. This spin orientation makes it very easy to switch an in-plane polarized magnetic free layer, as is demonstrated in several previous publications (e.g., L. Liu et al., "Spin-Torque Switching with the Giant Spin Hall Effect of Tantalum," Science, Volume 336, No. 6081, 4 May 2012, pp. 555-558; and C. F. Pai, L. Liu, Y. Li, H. W. Tseng, D. C. Ralph, R. A. Buhrman, Appl. Phys. Lett. 101, 122404 (2012)). However, it would be very difficult to use ordinary SHE to switch a magnetic layer with perpendicular magnetic anisotropy (PMA). In this situation, the injected spins and the magnetic moment orientation of the free layer are orthogonal to each other. Therefore, the free layer magnetic moment cannot be switched through the conventional anti-damping spin transfer torque mechanism.

In some embodiments of the present disclosure, instead of using the standard spin Hall effect to switch a free layer magnetic moment, the anomalous Hall effect (AHE) or a polarized Spin Hall Effect (PSHE) is used to switch a magnetic moment of a magnetic free layer having PMA. Unlike the standard SHE wherein spins are generated out of non-magnetic heavy element materials, the AHE/PSHE relies on materials with spontaneous magnetic moment. Thus, the spin orientation from the AHE/PSHE not only depends upon the geometrical orientation, but also on the magnetic moment orientation of the AHE/PSHE material. Therefore, one can inject out-of-plane polarized spins into the magnetic free layer and use this spin current to switch the magnetic moment of a magnetic free layer with PMA through the anti-damping mechanism. The fact that the spin current are partially out of plane polarized will make it much more efficient than the standard SHE when switching PMA materials. Previous approaches to finding practical applications for the AHE mainly focus on utilizing the AHE voltage. Under the present disclosure, instead of utilizing the out of equilibrium electron charge accumulation, embodiments utilizes the out of equilibrium spins generated from AHE (or PSHE) materials. Thus, by using AHE/PSHE the switching current of MTJs can be reduced by about 10 times while the standard, non-magnetic SHE can only reduce the switching current by roughly 2 times for PMA MTJs. In some embodiments, an asymmetric bottom lead may be used, such that a tunneling current flows towards one side after it leaves a free layer of the MTJ.

Figure 1B:
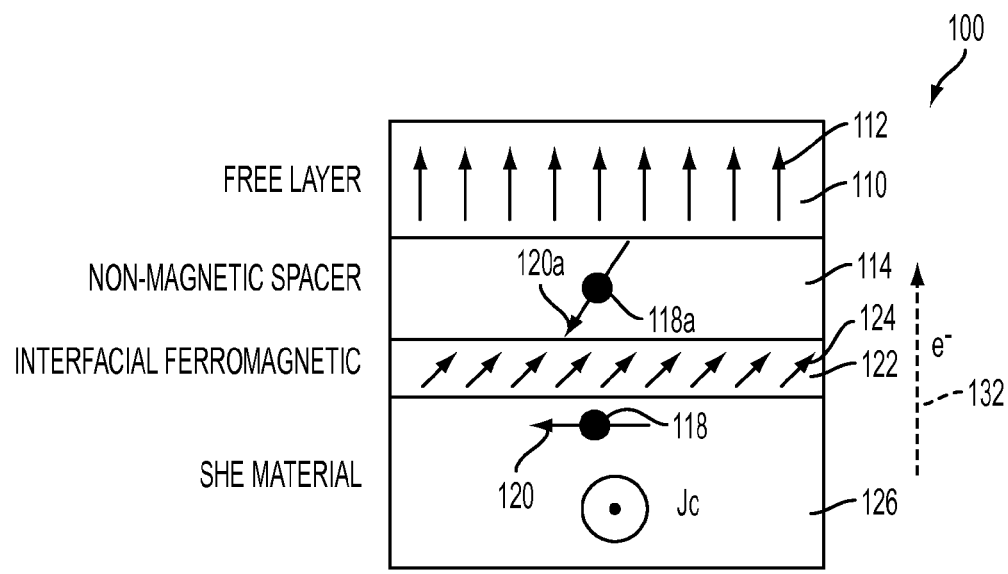

FIG. 1a is three dimensional diagram illustrating selected layers of a memory cell 100 of one or more embodiments, and FIG. 1b is a side view of memory cell 100. As shown, memory cell 100 includes a SHE layer 126, a ferromagnetic (FM) layer 122, a magnetic moment 124 of ferromagnetic FM layer 122, a non-magnetic spacer layer 114, a free layer 110, and a magnetic moment 112 of free layer 110, configured as shown. For ease of illustration, only a representative magnetic moment 124 of ferromagnetic layer 122 is provided with a reference number in the accompanying drawings. Similarly, only a representative magnetic moment 112 of free layer 110 is provided with a reference number in the accompanying drawings. The intrinsic spin of SHE layer 126, which is the spin equilibrium when no current flows through SHE layer 126, is represented by the dotted line circles 134. As a current ($J_c$) flows through SHE layer 126, hall effect spin electrons 118 accumulate at the surfaces of SHE layer 126. The migration of hall effect spin electrons 118 toward the SHE layer surfaces is represented by curved dotted line arrows 136. Spin direction arrows 120 identify the spin direction of hall effect spin electrons 118. Additional spin electrons, which are referred to herein as polarized SHE (PSHE) electrons 118a having PSHE spin direction 120a, accumulate in non-magnetic spacer layer 114 as described in more detail later in this disclosure. For ease of illustration, only representative spin electrons 118, spin directions 120, dotted line circles 134 and curved dotted line arrows 136 are provided with reference numbers in the accompanying drawings.

FM layer 122 and SHE layer 126 combine to provide a polarized SHE (PSHE). FM layer 122 (which is preferably relatively thin) improves the efficiency at which spin current ($e^-$) 132 generated from SHE layer 126 switches magnetic moment 112 of free layer 110. FM layer 122 in effect re-aligns the in-plane oriented spins of SHE layer 126 into perpendicular oriented spins of non-magnetic spacer layer 114, thereby allowing for very efficient anti-damping switching of magnetic moment 112, which is shown as having perpendicular to plane magnetic anisotropy (PMA). Preferably, FM layer 122 is constructed such that it has a relatively weak perpendicular anisotropy. Thus, when in equilibrium, magnetic moment 112 of free layer 110 will be oriented neither in plane nor fully out of plane (i.e., perpendicular), but will instead have a certain angle with respect to the film plane. This partially out of plane orientation of magnetic moment 112 can be achieved either through the free layer's intrinsic anisotropy properties, by applying an in-plane external field onto a perpendicularly oriented film, or equivalently by applying a perpendicular to plane external field onto an in-plane oriented film.

Figure 1C:
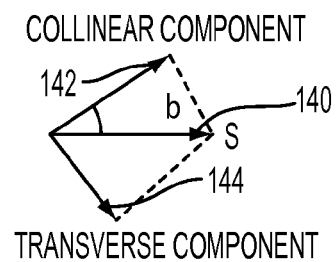
FIG. 1c is diagram illustrating components of the spin orientation generated from the memory cell shown in FIGS. 1a and 1b.

FIG. 1c is diagram illustrating the components 142, 144 of the original SHE spin orientation (S) 140 generated from memory cell 100 shown in FIGS. 1a and 1b. When non-equilibrium spins are injected into a magnetic layer, a transverse component 144 of the original SHE spin orientation (S) 140 that is perpendicular to the local magnetic moment will be absorbed within a very short distance (e.g., approximately one monolayer), and this part of the spin angular momentum will be transferred from the conduction electrons to the magnetic layer's magnetic moment. This is in effect the so-called "spin transfer torque" mechanism. Meanwhile, a collinear component 142 of the original SHE spin orientation 140 will be kept, and the decay rate for this part of the spin is very slow. Beta ($\beta$) is the angle between the direction of collinear component 142 and original SHE spin orientation 140. Collinear component 142 decays within a spin diffusion length, which is usually in the order of a few nanometers to a few tens nanometers for ordinary ferromagnetic metals. Therefore, the originally in-plane polarized spins, after being re-oriented by FM layer 122 (shown in FIGS. 1a and 1b) at the interface, will have a perpendicular to plane component 142. These partially perpendicular spins are shown in FIGS. 1a and 2b as PSHE electrons 118a having PSHE spin direction 120a. Thus, partially perpendicular, PSHE electrons 118a can cause switching through the anti-damping mechanism when they enter free layer 110. As previously described, in order to prevent coupling between FM layer 122 and free layer 110, spacer layer 114 is provided. Spacer layer 114 is preferably a thin layer (e.g., a few nanometers) and constructed from a non-magnetic metal film.

The mechanism proposed above applies not only to situations in which the injected spins from the SHE material correspond to the majority spins of the FM interfacial layer, but also to the case when the injected spins are minority spins. If the charge current $J_c$ inside SHE layer 126 shown in FIG. 1a or 1b flows into the page, the spins pointing rightward would flow up to the top surface and be injected into FM layer 122. The collinear component of the injected spins corresponds to the majority spins of FM layer 122. After being re-oriented by local moment 124 of FM layer 122, the spins will be partially out of plane and can induce switching of magnetic moment 112 of free layer 110. If the charge current $J_c$ flows out of the plane, the spins pointing to the left will flow upward and accumulate at the top surface of SHE layer 126. If the spins are decomposed along two orthogonal directions, the collinear component of the non-equilibrium spins corresponds to the minority spin direction of FM layer 122. The minority spins can also keep their orientation as long as the thickness of FM layer 122 is much smaller than its spin diffusion length. The minority spins will then flow through spacer layer 114 into FM free layer 110 to switch magnetic moment 112.

Figure 2:
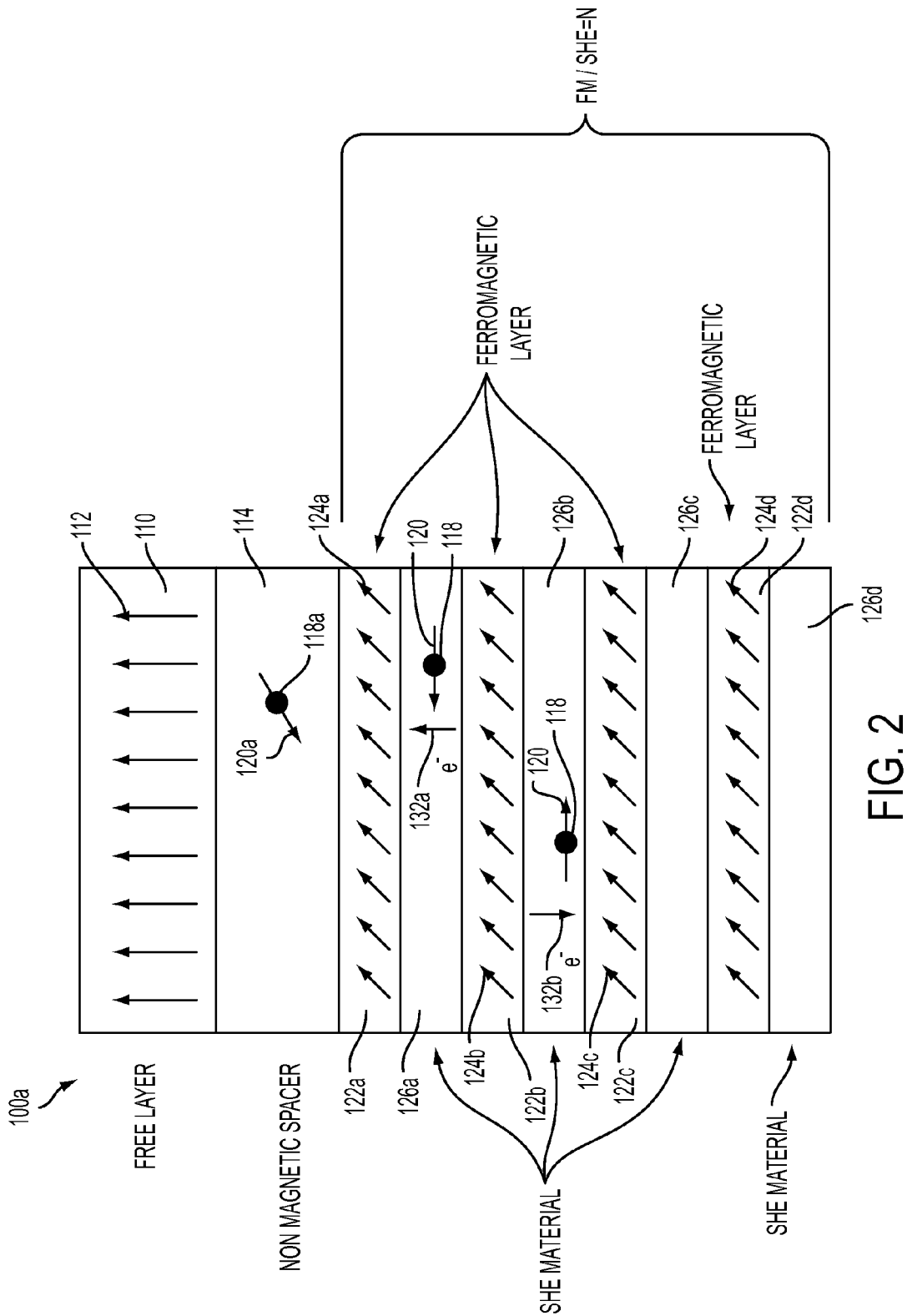
FIG. 2 is another configuration of the side view shown in FIG. 1b.

FIG. 2 illustrates another storage element 100a embodying the present disclosure. Storage element 100a is similar to storage element 100 (shown in FIGS. 1a and 1b) but includes multiple FM layers 122a-122d and multiple SHE layers 126a-126d, configured as shown. Although four FM/SHE layer pairs are shown, the layer pairs can be repeated any number (N) of times. As shown in FIG. 2, inside the [FM/SHE]$_N$ multilayer structures, the left-pointing spins move upward while the right-pointing spins move downward. For the thin FM layers 122a-122d, the spin torque from their top and bottom neighboring SHE layers 126a-126d will cancel each other and will not experience a net spin torque. However, the interfacial FM layer 122a can still filter the spins injected into it. Because of the multilayered structure of storage element 100a, the total magnetic moment 124a-124d of ferromagnetic layers 122a-122d should be more stable in comparison to the single FM/SHE layer pair 122, 126 shown in FIGS. 1a and 1b. Additionally, modulation of the FM magnetic moments 124a-124d on the spin Hall effect generated spin should be also stronger.

Figure 3:
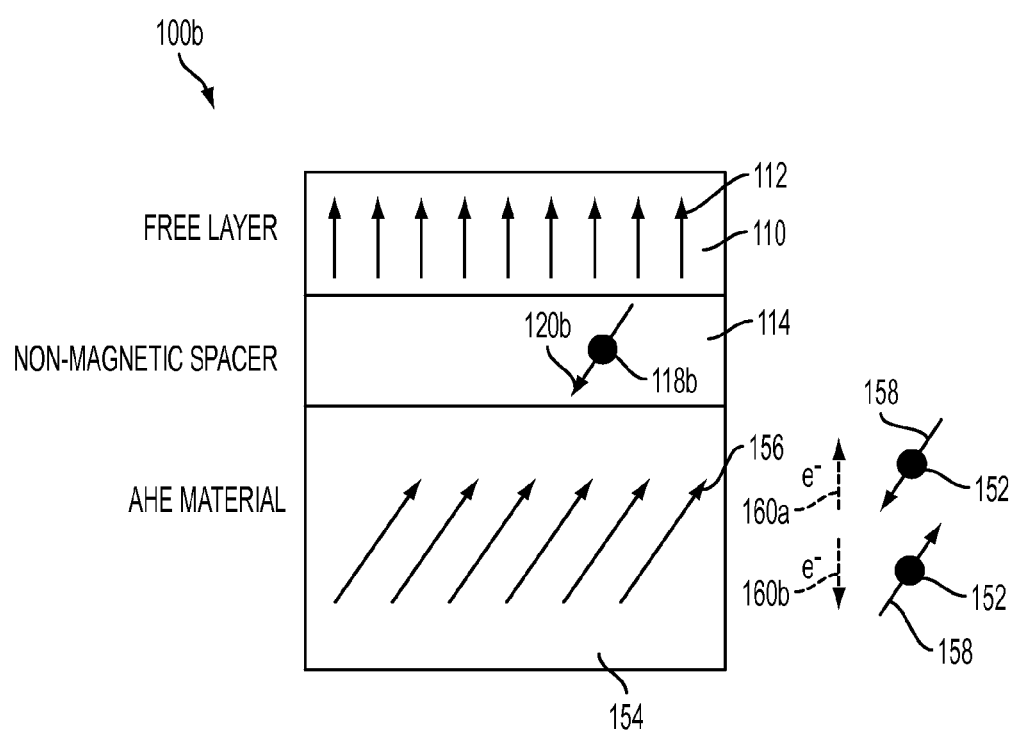
FIG. 3 is another configuration of the side view shown in FIG. 2.

FIG. 3 illustrates another storage element 100b embodying the present disclosure. Instead of multiple FM/SHE layers, storage element 100b utilizes a whole piece of FM film 154. FM film 154 has an intrinsic magnetic moment 156, which can be partially tilted out of plane. At the same time, FM film 154 may be constructed such that it is a compound or alloy of heavy elements, e.g., FePt, CoPt. Thus, FM film 154 would also have a strong spin orbit scattering (e.g., spin 152, spin direction 158) to generate large spin currents 160a, 160b. Thereby, FM 154 may be implemented by materials with anomalous hall effect (AHE). Previous approaches to applying AHE mainly focus on utilizing the AHE voltage. Under the present disclosure, instead of utilizing the out of equilibrium electron charge accumulation, the present disclosure utilizes the out of equilibrium spins generated from AHE materials.

Figure 4:
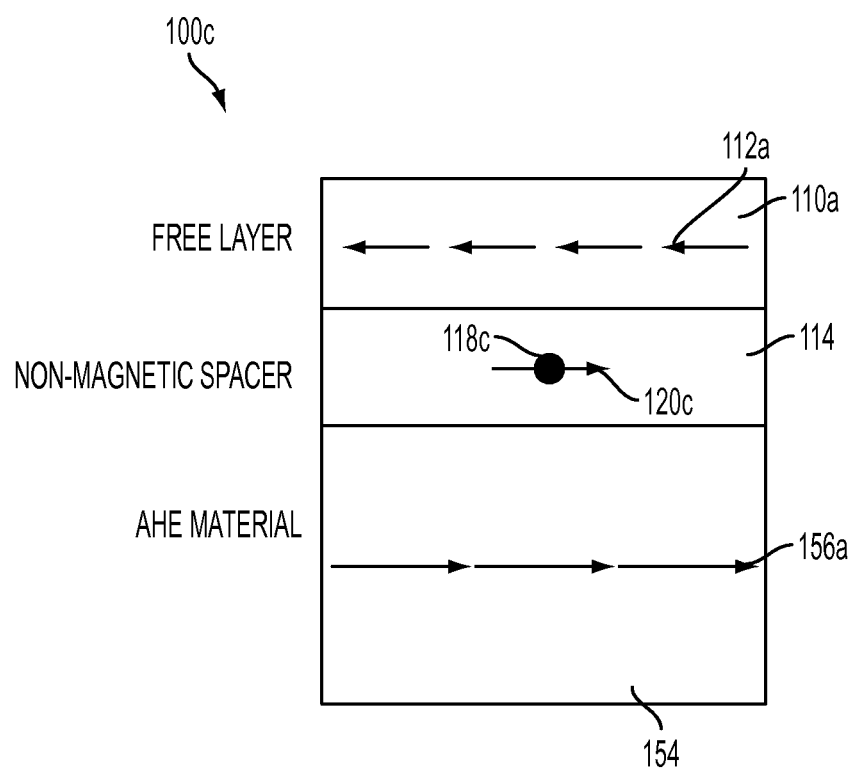
FIG. 4 is another configuration of the side view shown in FIG. 3.

FIG. 4 illustrates another storage element 100c in accordance with the present disclosure and having in-plane anisotropy, wherein the magnetic moment 112a of free layer 110a and the magnetic moment 156a of AHE (or PSHE) layer 154 are oriented in the film plane at equilibrium. Thus, in addition to the PMA configurations shown in FIGS. 1a, 1b, 2 and 3, the present disclosure may also be utilized to switch storage elements having in-plane anisotropy.

Figure 5A:
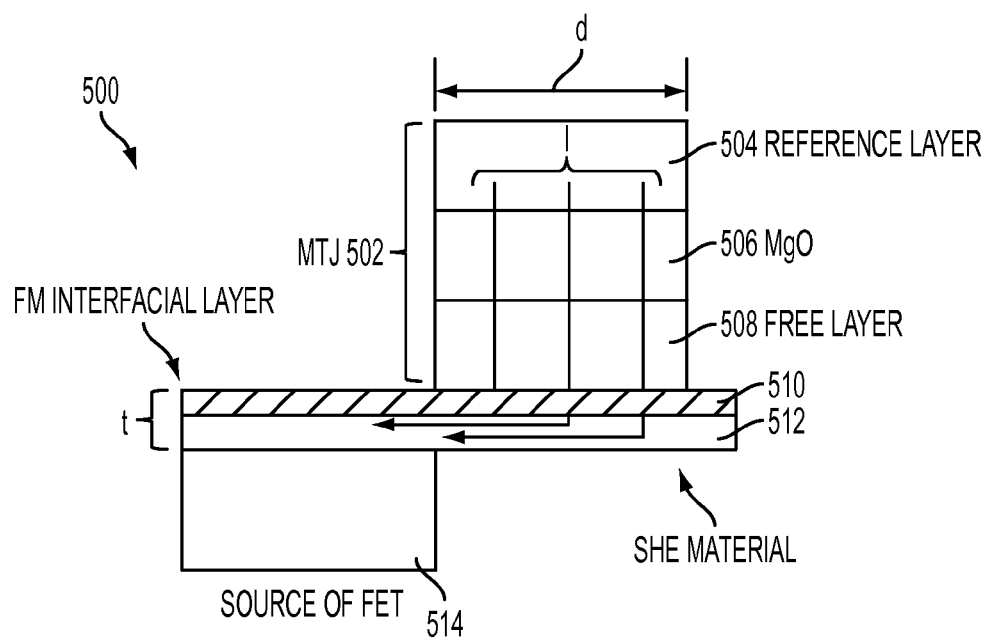
FIG. 5a is a block diagram of an STT-MRAM in accordance with one or more embodiments.
Figure 5B:
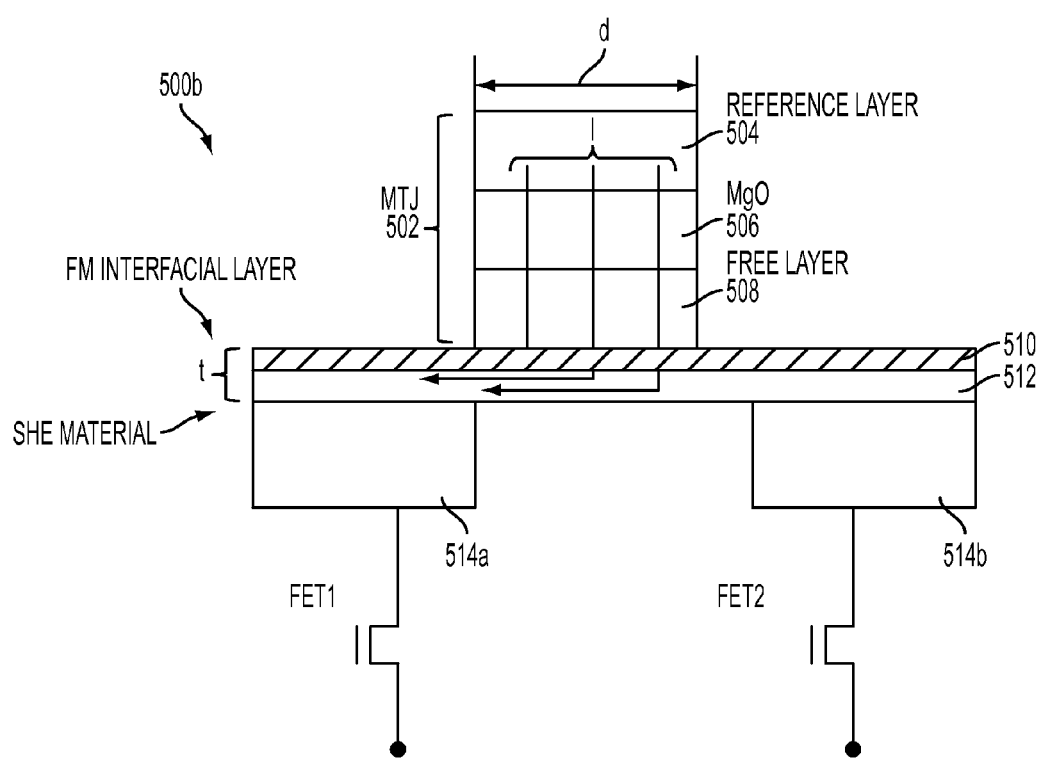
FIG. 5b is a block diagram of another STT-MRAM in accordance with one or more embodiments.

FIGS. 5a and 5b illustrate STT-MRAM storage devices 500, 500a in accordance with the present disclosure. As shown in FIG. 5a, storage device 500 includes a two terminal geometry having the offset, non-columnar MTJ/FET structure disclosed in the previously described pending U.S. patent application, assigned to the assignee of the present disclosure and filed Mar. 15, 2013, entitled "SPIN HALL EFFECT ASSISTED SPIN TRANSFER TORQUE MAGNETIC RANDOM ACCESS MEMORY," by John K. DeBrosse, Luqiao Liu and Daniel Worledge, having U.S. application Ser. No. 13/835,355, and expressly incorporated by reference herein. Referring to FIG. 5a, storage device 500 includes an MTJ 502 formed from a reference layer 504, a magnesium oxide (MgO) junction 506 and a free layer 508, configured as shown. Storage device 500 further includes a FM layer 510, a SHE layer 512 and a source (or drain) of a field effect transistor (FET) 514, configured as shown. FM/SHE layers 510, 512 correspond to FM/SHE layers 122, 126 shown in FIGS. 1a and 1b. Like FM/SHE layers 122, 126, FM/SHE layers 510, 512 may be implemented as multiple FM/SHE layers (as shown in FIG. 2), or as a whole piece of FM film constructed from materials with anomalous Hall effect (AHE) (as shown in FIGS. 3 and 4). MTJ 502 of storage device 500 may be offset or misaligned from the source (or drain) of FET 514 such that the width of the MTJ 502 will be different from the width of the FM/SHE layers 510, 512 and the MTJ 502, FM/SHE layers 510, 512 and FET 514 will be non-columnar with respect to each other. Thus, free layer 508 may be coupled to FET 514 via FM/SHE layers 510, 512, which may have a combined thickness t. In some embodiments, the thickness t may be on the order of 2 nm to 10 nm. Current (I) that flows under free layer 508 may have a horizontal component that may cause a spin current to be generated due to FM/SHE layers 510, 512. The generated spin current may be injected into the free layer 508 and exert torque onto the magnetic moment of free layer 508.

FIG. 5b illustrates storage device 500a, which includes a three terminal geometry also having the offset MTJ structure disclosed in the previously described pending U.S. patent application Ser. No. 13/835,355 assigned to the assignee of the present disclosure. As shown in FIG. 5b, each storage device 500a will require two FETs, 514a, 514b, wherein one FET is positioned on each side of the FM/SHE layers 510, 512 under MTJ 502.

Turning now to a description of the operation of storage devices 500, 500a, for an ordinary MTJ, it can be assumed that the spin current density needed to switch a magnetic moment of the MTJ using spin torque generated by the tunneling current is $J_{s\_c}$. Thus, the charge current density required would be $J_s/P$, where P is the spin polarization of the MTJ, and the total current for switching is $I_{c1}=(J_{s\_c}/P)*d^2$, where d (shown in FIGS. 5a and 5b) is the dimension of the MTJ cross section. For the three terminal device 500b as shown in FIG. 5b, in order to switch a magnetic moment of MTJ 502 with the polarized SHE or the AHE, the horizontally flowing current density under MTJ 502 should be $J_{s\_c}$/cos(beta)*cos(90 deg−beta)*theta. Theta is the spin Hall angle, and beta (β shown in FIG. 1c) is the angle between the direction of the magnetic moment of the AHE (or FM/SHE) material and the perpendicular direction as is shown in FIG. 1b. Therefore, the total current required to switch the magnetic moment is $I_{c2}=[J_{s\_c}/\cos(\beta)*\cos(90°-\beta)*\theta]*d*t$, where t is the thickness of the FM/SHE layer 510, 512 (i.e., either AHE or polarized SHE). Thus, the ratio between the two critical currents is $I_{c1}/I_{c2}=\text{theta}*\cos(\beta)*\cos(90°-\beta)*d/(P*t)$. For materials with high spin Hall angle, the spin Hall angle is comparable to the spin polarization of the MTJ. Therefore, theta is approximately equal to P. Accordingly, $I_{c1}/I_{c2}=0.5*d/t$ when the angle β is chosen to be 45 degrees. Generally, for high density MRAMs, d is about 30 nm, while t can be as low as 2 nm. Therefore, the critical current $I_{c2}$ is 7.5 times smaller than $I_{c1}$. For larger MTJs, d is larger, so this ratio can be even higher than 10. For the two terminal device 500a shown in FIG. 5a, the critical current for spin Hall effect switching would be about 3.75 times smaller than $I_{c1}$, instead of 7.5 times smaller, because only half of the tunneling current flows horizontally under MTJ 502 in the two terminal configuration 500a. For materials with even higher spin Hall angles, the reduction to the critical current would be correspondingly larger.

In general, suitable materials for the disclosed embodiments may be any combination of ferromagnetic/non-ferromagnetic bilayers, ferromagnetic/non-ferromagnetic multi-layers, and ferromagnetic single layers. Specific suitable materials include but are not limited to Fe/Pt bilayer, Fe/Ta bilayer, Fe/W bilayer, Fe/CuBi alloy bilayer, $Fe/Bi_2Se_3$ bilayer, $Fe/Bi_2Te_3$ bilayer, Co/Pt bilayer, Co/Ta bilayer, Co/W bilayer, Co/CuBi alloy bilayer, $Co/Bi_2Se_3$ bilayer, $Co/Bi_2Te_3$ bilayer, Fe/Pt multi-layers, Fe/Ta multi-layers, Fe/W multi-layers, Fe/CuBi alloy multi-layers, $Fe/Bi_2Se_3$ multi-layers, $Fe/Bi_2Te_3$ multi-layers, Co/Pt multi-layers, Co/Ta multi-layers, Co/W multi-layers, Co/CuBi alloy multi-layers, $Co/Bi_2Se_3$ multi-layers, $Co/Bi_2Te_3$ multi-layers, FePt alloy, FePd alloy, FeTa alloy, FeW alloy, CoPt alloy, CoPd alloy, CoTa alloy, CoW alloy and CoFeBi.

Figure 6:
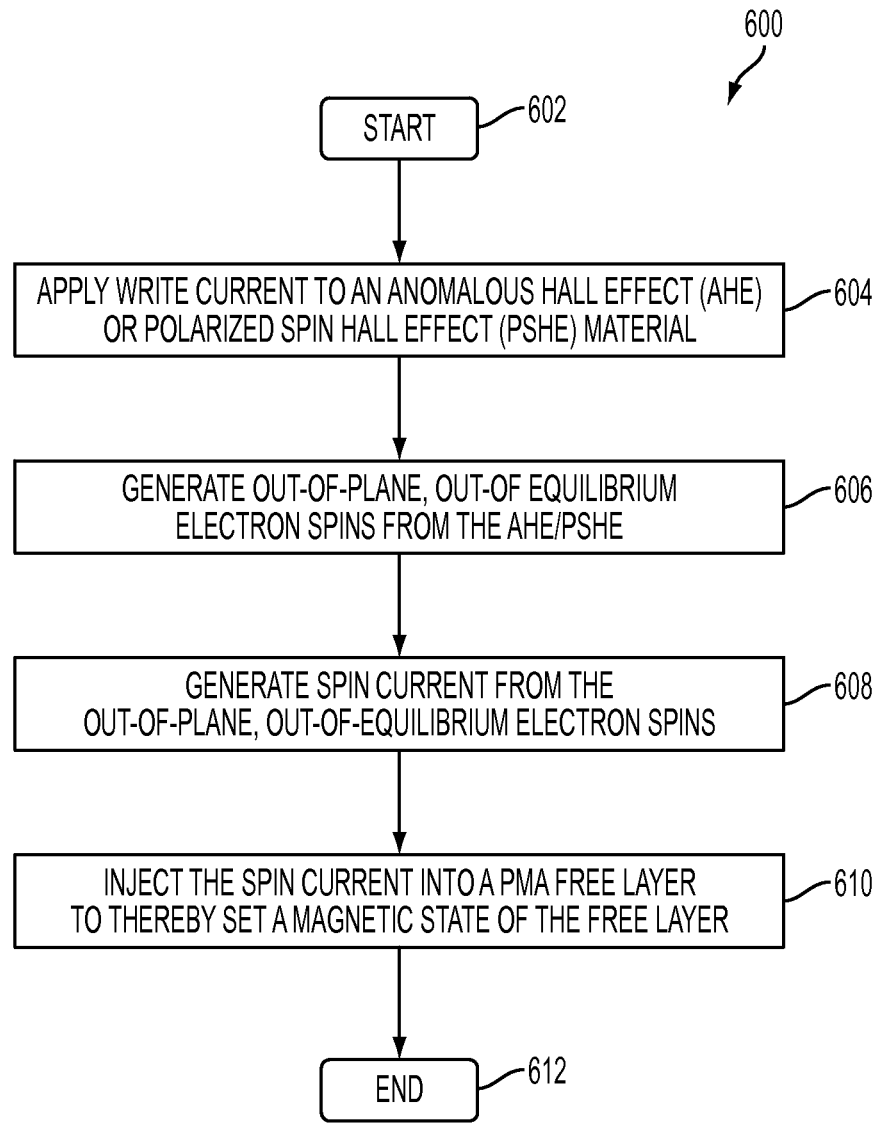
FIG. 6 is a flow chart of an exemplary method.

Turning now to FIG. 6, a flow chart of an exemplary method 600 in accordance with one or more embodiments is shown. The method 600 may be used to set a magnetic state of a free layer, wherein the free layer is part of an MTJ storage element, and the MTJ is part of an overall STT-MRAM storage device.

Method 600 starts at block 602 then moves to block 604 to apply write current to an anomalous hall effect (AHE) or polarized spin hall effect (PSHE) material. Block 606 then generates out-of-plane, out-of-equilibrium electron spins from the AHE/PSHE. Block 608 generating a spin current from the out-of-plane, out-of-equilibrium electron spins, and block 610 injects the spin current into a PMA free layer to thereby set a magnetic state of the free layer. The magnetic state may be a magnetic moment. Method 600 ends at block 612.

Method 600 is illustrative. In some embodiments, one or more of the blocks (or portions thereof) may be optional. In some embodiments, one or more blocks or operations not shown may be included. In some embodiments, the blocks or operations may execute in an order or sequence different from what is shown in FIG. 6.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method of setting a magnetic state of a free layer, the method comprising:
    applying a write current to a magnetic layer that exhibits an anomalous hall effect (AHE) in response to said write current;
    said AHE generating out-of-equilibrium electron spins;
    said out-of-equilibrium electron spins generating a spin current; and
    injecting said spin current into the free layer, thereby setting the magnetic state of the free layer.

2. The method of claim 1 wherein:
    the free layer comprises perpendicular magnetic anisotropy (PMA); and
    said electron spins comprise an out-of-plane direction.

3. The method of claim 2 further comprising separating said magnetic layer from the free layer with a spacer layer to prevent coupling between said magnetic layer and the free layer.

4. The method of claim 2 wherein said setting the magnetic state of the free layer comprises exerting a torque on a magnetic moment of the free layer.

5. The method of claim 2 wherein said setting the magnetic state of the free layer comprises switching a magnetic moment of the free layer.

6. The method of claim 2 wherein said magnetic layer is non-columnar with respect to the free layer.

7. The method of claim 2 wherein the free layer comprises part of a spin transfer torque magnetic random access memory (STT-MRAM).

8. The method of 2 wherein said magnetic layer comprises:
    at least one ferromagnetic layer; and
    at least one layer that exhibits a spin hall effect (SHE) in response to said write current.

9. The method of claim 8 wherein:
    said at least one SHE layer generates out-of-equilibrium, in-plane oriented electron spins; and
    said at least one ferromagnetic layer re-aligns said in-plane oriented electron spins to said out-of-plane direction.

10. The method of claim 9 further comprising separating said at least one ferromagnetic layer from the free layer with a spacer layer to prevent coupling between said at least one ferromagnetic layer and the free layer.

11. A spin transfer torque magnetic random access memory (STT-MRAM) comprising:
    a free layer having a magnetic state;
    a magnetic layer that exhibits an anomalous hall effect (AHE) in response to a write current;
    said AHE generating out-of-equilibrium electron spins; and
    said out-of-equilibrium electron spins generating a spin current;
    whereby said AHE injects said spin current into said free layer to set said magnetic state of said free layer.

12. The apparatus of claim 11 wherein:
    said free layer comprises perpendicular magnetic anisotropy (PMA); and
    said electron spins comprise an out-of-plane direction.

13. The apparatus of claim 12 further comprising a spacer layer that prevents coupling between said magnetic layer and said free layer.

14. The apparatus of claim 12 wherein:
    said magnetic state comprises a magnetic moment; and
    said spin current exerts a torque on said magnetic moment.

15. The apparatus of claim 14 wherein said torque switches said magnetic moment.

16. The apparatus of claim 12 wherein said magnetic layer is non-columnar with respect to said free layer.

17. The apparatus of claim 12 further comprising at least one transistor coupled to said magnetic layer.

18. The apparatus of 12 wherein said magnetic layer comprises:
    at least one ferromagnetic layer; and
    at least one layer that exhibits a spin hall effect (SHE) in response to said write current.

19. The apparatus of claim 18 wherein:
    said at least one SHE layer generates out-of-equilibrium, in-plane oriented electron spins; and
    said at least one ferromagnetic layer re-aligns said in-plane oriented electron spins to said out-of-plane direction.

20. The apparatus of claim 19 further comprising a spacer layer that prevents coupling between said at least one ferromagnetic layer and said free layer.

* * * * *